United States Patent
Fustos

(10) Patent No.: US 10,210,129 B2
(45) Date of Patent: Feb. 19, 2019

(54) SYSTEMS AND METHODS FOR DESERIALIZING DATA

(71) Applicant: Sensors Unlimited, Inc., Princeton, NJ (US)

(72) Inventor: Richard J. Fustos, Princeton, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 156 days.

(21) Appl. No.: 15/173,979

(22) Filed: Jun. 6, 2016

(65) Prior Publication Data

US 2017/0351634 A1    Dec. 7, 2017

(51) Int. Cl.
| | |
|---|---|
| G06F 13/42 | (2006.01) |
| G06F 1/10 | (2006.01) |
| H03M 9/00 | (2006.01) |
| G06F 5/06 | (2006.01) |
| G06F 13/38 | (2006.01) |
| H04L 7/04 | (2006.01) |

(52) U.S. Cl.
CPC .......... *G06F 13/4221* (2013.01); *G06F 1/10* (2013.01); *G06F 5/06* (2013.01); *G06F 13/385* (2013.01); *G06F 13/4282* (2013.01); *H03M 9/00* (2013.01); *H04L 7/04* (2013.01)

(58) Field of Classification Search
None
See application file for complete search history.

(56) References Cited

U.S. PATENT DOCUMENTS

| | | | | |
|---|---|---|---|---|
| 4,139,839 A | * | 2/1979 | Fletcher | H03M 9/00 341/81 |
| 4,393,301 A | * | 7/1983 | Svendsen | H03M 9/00 377/118 |
| 6,169,501 B1 | * | 1/2001 | Ryan | H03M 9/00 341/100 |
| 6,894,530 B1 | * | 5/2005 | Davidson | H03K 19/17732 326/38 |
| 6,903,575 B1 | * | 6/2005 | Davidson | H01L 27/11898 257/E27.11 |
| 7,180,046 B2 | | 2/2007 | Tinkler et al. | |
| 7,307,559 B2 | * | 12/2007 | Kobayashi | H03M 9/00 341/101 |
| 7,446,680 B2 | * | 11/2008 | Kobayashi | H03M 9/00 341/100 |
| 7,793,013 B1 | | 9/2010 | Esposito | |

(Continued)

OTHER PUBLICATIONS

'LVDS Source Synchronous 7:1 Serialization and Deserialization Using Clock Multiplication' Application Note by Nick Sawyer, Mar. 18, 2015.*

(Continued)

*Primary Examiner* — Steven G Snyder
(74) *Attorney, Agent, or Firm* — Locke Lord LLP; Scott D. Wofsy; Christopher J. Cillié

(57) ABSTRACT

A digital communication interface includes a deserializer module, a gearbox module, and a parallel communication channel connecting the gearbox module to the deserializer module. The deserializer module has a fixed deserialization factor. The gearbox module has a temporal translation factor to change bit-length of words received through the parallel communication channel to bit-length suitable for a downstream data path.

16 Claims, 5 Drawing Sheets

(56) References Cited

U.S. PATENT DOCUMENTS

| | | | |
|---|---|---|---|
| 7,876,900 B1* | 1/2011 | Goergen | H04K 1/00 |
| | | | 380/255 |
| 7,982,639 B1 | 7/2011 | Wortman | |
| 8,477,897 B1* | 7/2013 | Chang | H03K 5/135 |
| | | | 375/372 |
| 8,902,954 B2 | 12/2014 | Hudson et al. | |
| 8,949,448 B1* | 2/2015 | Saxtorph | H04L 69/28 |
| | | | 341/61 |
| 9,286,260 B2* | 3/2016 | Rao | H03M 9/00 |
| 9,438,355 B2* | 9/2016 | Blumenthal | H04B 10/40 |
| 2004/0114699 A1* | 6/2004 | Alderrou | H04L 7/08 |
| | | | 375/368 |
| 2004/0135614 A1* | 7/2004 | Xiao | H03K 5/00006 |
| | | | 327/291 |
| 2004/0172570 A1* | 9/2004 | Miyajiri | G11B 20/1403 |
| | | | 713/400 |
| 2005/0046501 A1* | 3/2005 | Moore | H03L 7/099 |
| | | | 331/117 FE |
| 2006/0192701 A1* | 8/2006 | Kobayashi | H03M 9/00 |
| | | | 341/101 |
| 2008/0001794 A1* | 1/2008 | Kobayashi | H03M 9/00 |
| | | | 341/100 |
| 2009/0034728 A1* | 2/2009 | Goergen | H04L 25/03866 |
| | | | 380/268 |
| 2014/0298075 A1* | 10/2014 | Rao | G06F 13/4291 |
| | | | 713/600 |

OTHER PUBLICATIONS

'Introduction to 10 Gigabit 64b/66b (Clause 49)' by Sowmya S. Luckoor, Oct. 22, 2001.*
'Source-Synchronous Serialization and Deserialization (up to 1050 Mb/s)' Application Note by Nick Sawyer, Jun. 3, 2010.*
'AN 479: Design Guidelines for Implementing LVDS Interfaces in Cyclone Series Devices' by Altera, Jul. 2013.*

* cited by examiner

SYSTEMS AND METHODS FOR DESERIALIZING DATA

BACKGROUND OF THE INVENTION

1. Field of the Invention

The present disclosure relates to data communication, and more particularly to translating deserialized parallel data into words of bit-length corresponding to serial word bit-length.

2. Description of Related Art

Digital devices commonly process data internally in parallel and pass data between devices serially allowing for a single conductive or wireless interface to carry data between the devices. The word size for a given digital device is typically selected for a contemplated device application, certain types of imaging devices for example generating digital data packaged as words having an odd number of bits and/or a bit size greater than ten bits.

Serialization typically involves loading a dephasing register with N parallel bits, and emptying the dephasing register serially. Deserialization typically involves loading a phasing register serially and emptying the phasing register in parallel. In some devices, such as high-speed low-voltage digital switching communication, there can be a mismatch between the bit size of words between data provided by the device and the bit size of words communicated within the device. For example, some devices limit the number of bits that can be deserialized in a word, thereby making it impossible to deserialize data having an odd number of bits or words with more than ten bits.

Such conventional methods and systems have generally been considered satisfactory for their intended purpose. However, there is still a need in the art for improved deserialization devices. The present disclosure provides a solution for this need.

SUMMARY OF THE INVENTION

A digital communication interface includes a deserializer module, a gearbox module, and a parallel communication channel connecting the gearbox module to the deserializer module. The deserializer module has a fixed deserialization factor. The gearbox module has a temporal translation factor to change bit-length of words received through the parallel communication channel to a bit-length suitable for a downstream data path channel.

In certain embodiments, one or more of the deserializer module, the gearbox module, and the parallel communication channel can be implemented in a field programmable gate array (FPGA) device. The temporal translation factor of the gearbox module can be greater than the fixed deserialization factor. The temporal translation factor of the gearbox module can be equivalent to the fixed deserialization factor. The temporal translation factor of the gearbox module can be smaller than the fixed deserialization factor. It is contemplated that the fixed deserialization factor can be 10:1 and the temporal translation factor can be 8:1, 10:1, or 14:1.

In accordance with certain embodiments, the gearbox module can include memory module. The gearbox module can include an input finite state machine (FSM) module. The input FSM module can be connected in series between the deserialization module and the memory block. The gearbox module can include an output FSM module. The output FSM module can be connected to the memory block. An output latches block can be connected to the memory block.

It is also contemplated that, in accordance with certain embodiments, the gearbox module can include a phase-locked loop (PLL) module. The PLL module can be connected to the input FSM module. An input clock lead can be connected to the PLL module for writing data to the memory block according to an input clock signal provided to the PLL module. The PLL module can be connected to the output FSM module. An output lead can connect the PLL module to the output FSM module for reading data out of the memory block according to a clock output signal generated by the PLL module. The PLL module can be arranged to cause the output FSM module to read data out of the memory block according to a ratio of the fixed deserialization factor and the temporal translation factor of the gearbox module.

A digital communication method includes receiving serial data having a first word bit-length. The serial data is deserialized into parallel data using a hard-coded deserialization factor such that the deserialized, parallel data has a second word bit-length. The deserialized, parallel data is further translated by the gearbox into translated, parallel data using a programmed translation factor with a third word bit-length. The third word bit-length is equivalent to the first word bit-length.

In certain embodiments, the third word bit-length can be smaller than the second word bit-length. The third word bit-length can be equivalent to the second word bit-length. The third word bit-length can be greater than the second word bit-length. The translated, parallel data can be read from the memory block at a rate that corresponds to ratio of the fixed deserialization factor and the temporal translation factor. The ratio can be less than one, equal to one, or greater than one. It is contemplated that the fixed deserialization factor can be set by applying power to a field programmable gate array device. The temporal translation factor can be set while power is applied to a field programmable gate array device. The temporal translation can be set by changing an output word bit-size signal.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
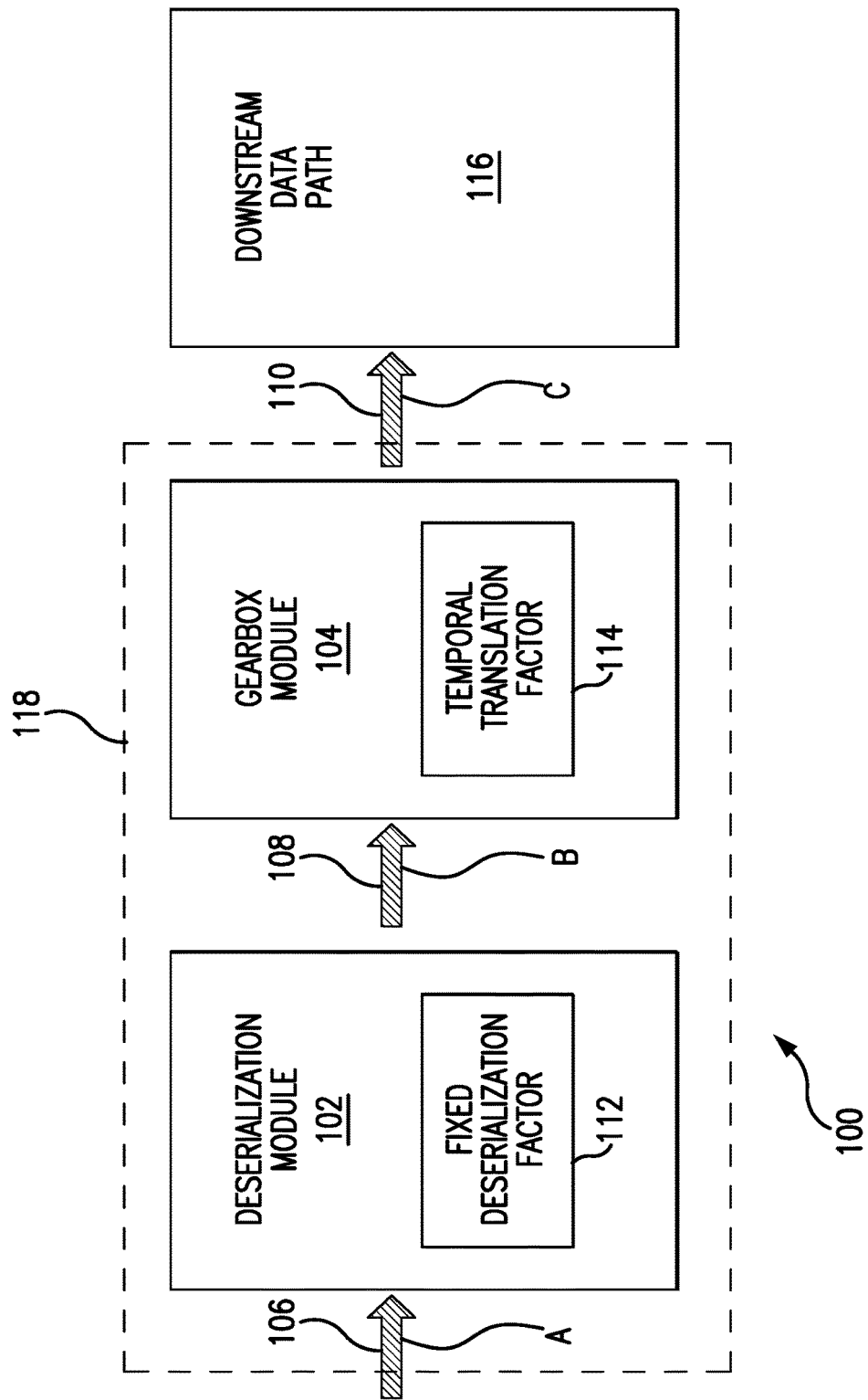
FIG. 1 is a schematic view of a digital communication device constructed in accordance with the present disclosure, showing a deserializer module with a fixed deserialization factor and a gearbox module with a temporal translation factor.

Reference will now be made to the drawings wherein like reference numerals identify similar structural features or aspects of the subject disclosure. For purposes of explanation and illustration, and not limitation, a partial view of an exemplary embodiment of a digital communication interface in accordance with the disclosure is shown in FIG. 1 and is designated generally by reference character 100. Other embodiments of digital communication interfaces, field programmable gate array devices having such interfaces, and methods of digital communication in accordance with the disclosure, or aspects thereof, are provided in FIGS. 2-4, as will be described. The systems and methods described herein can be used for deserializing imaging sensor data having word size that is incompatible with downstream data processing devices, though the present disclosure is not limited to imaging sensors or to sensors in general.

Referring to FIG. 1, digital communication interface 100 is shown. Digital communication interface 100 includes a deserialization module 102, a gearbox module 104, an input serial data channel 106, an input parallel data channel 108, and an output parallel data channel 110. Input serial data channel 106 is connected to deserialization module 102 for providing input serial data thereto having a first word bit-length. Deserialization module 102 has a fixed, e.g., hard-coded, deserialization factor 112 for converting input serial data A having the first word bit-length into parallel data B having a second word bit-length, which deserialization module 102 applies to input serial data channel 106.

Input parallel data channel 108 applies parallel data B having second word bit-length to gearbox module 104. Gearbox module 104 has a temporal, e.g., programmed, translation factor 114, as further described below, for translating parallel data B received over input parallel data channel 108 into parallel data C having a third word bit-length, which gearbox module 104 applies to output parallel data channel 110. Output parallel data channel 110 connects gearbox module 104 with a downstream data path 116 for which third word bit-length of the translated parallel data is suitable, such as one or more imaging processing devices (not shown for reasons of clarity). Gearbox module 104 reconstitutes words arriving on input parallel data channel 108 into words having the same word bit-length as data received on input serial data channel 106.

In the illustrated exemplary embodiment deserialization module 102, gearbox module 104, and one or more of the input serial data channel 106, input parallel data channel 108, and output parallel data channel 110 are implemented as circuitry, software, or a combination of circuitry and software in a field-programmable gate array device (FPGA) 118, thereby providing configurability. Fixed deserialization factor 112 and temporal translation factor 114 are resident within program modules stored memory of FPGA 118. Fixed deserialization factor 112 is not readily accessible for reconfiguration after initial configuration of FPGA 118. Temporal translation factor 114 is accessible for reconfiguration and may be resident in volatile memory of FPGA 118.

In certain embodiments parallel data B has a word bit-length that is incompatible with downstream data path 116 while parallel data C has a word bit-length that is different than that of parallel data B, and is compatible with downstream data path 116. It is contemplated that parallel data C can have a word bit-length that is less-than, equal-to, or greater-than the word bit-length of parallel data B. For example, with a first exemplary temporal translation factor, parallel data B includes 10-bit words transmitted at a rate of 50 megahertz, and parallel data C include the data translated into 14-bit words transmitted at a rate of 35.71 megahertz. With a second exemplary temporal translation factor, parallel data C include the data translated into 8-bit words transmitted at a rate of 62.5 megahertz. With yet another temporal translation factor, parallel data C include the data translated into 10-bit words transmitted at a rate of 50 megahertz. As will be appreciated by those of skill in the art in view of the present disclosure, this provides the flexibility to reconfigure digital communication interface 100 according to change in input data received by digital communication interface 100.

Figure 2:
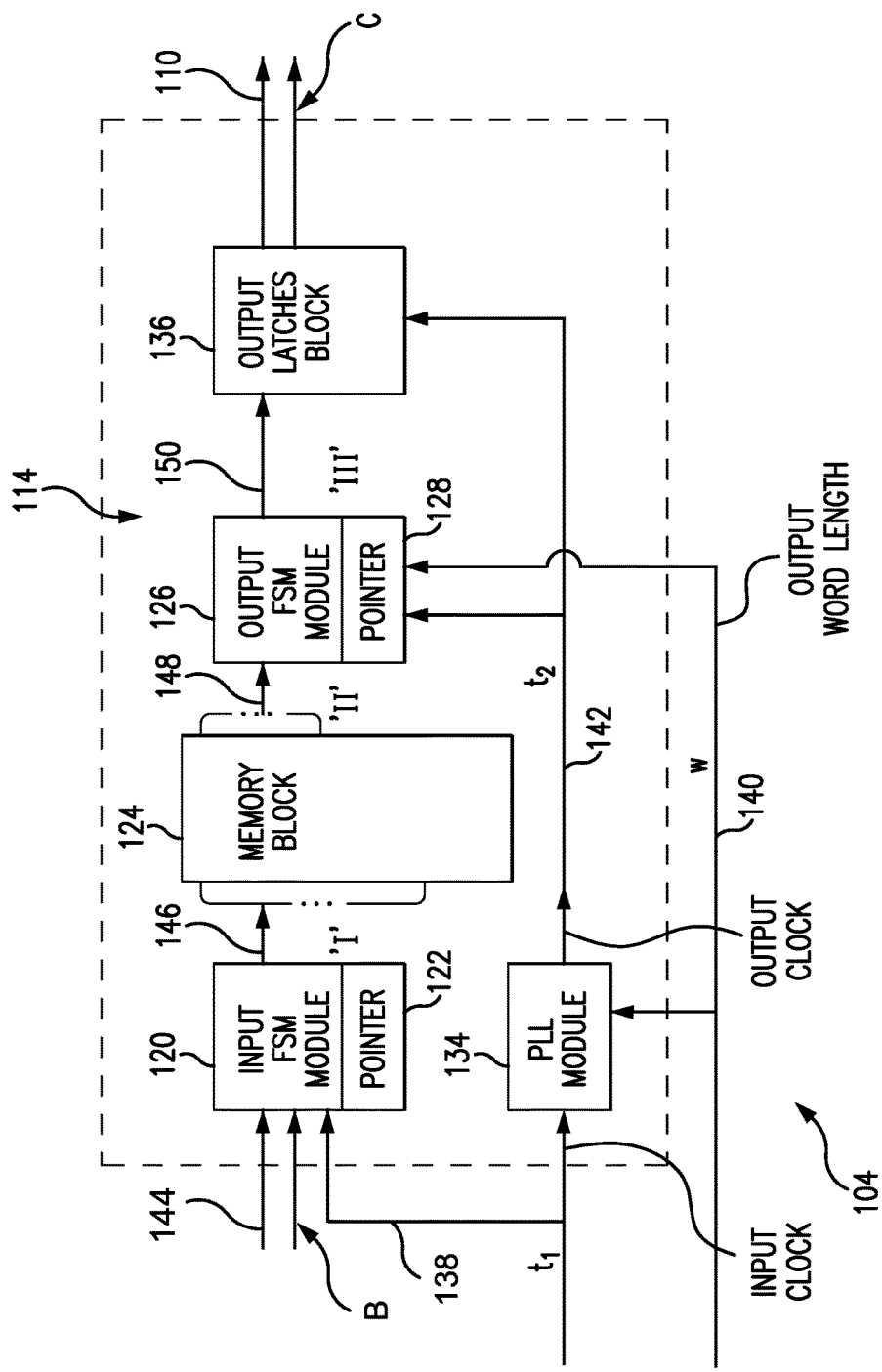
FIG. 2 is a block diagram of the digital communication device of FIG. 1, showing the gearbox module and temporal translation factor.

With reference to FIG. 2, architecture of gearbox module 104 is shown. Gearbox module 104 includes an input finite state machine (FSM) module 120 with a pointer 122, a memory block 124, an output FSM module 126 with an output FSM pointer 128, a phase-locked loop (PLL) module 134, and an output latches block 136. An input clock lead 138 is connected to input FSM module 120 and PLL module 134 for applying an input clock increment signal $t_1$ to input FSM module 120. An output bit-length lead 140 is connected to PLL module 134 and output FSM module 126 for applying a predetermined output bit-length signal B to PLL module 134 and output FSM module 126. An output clock lead 142 connects PLL module 134 with output FSM module 126 and output latches block 136 to provide an output clock increment signal $t_2$ generated by PLL module 134 to output FSM module 126 and output latches block 136.

A first parallel data lead 144 is connected to input FSM module 120 for receiving an input data flow I. A second parallel data lead 146 connects input FSM module 120 with memory block 124 such that input FSM module 120 can clock input data flow I into memory block 124 as a data flow II. In this respect input FSM module 120 is synchronized input clock increment signal $t_1$ such that bits of input data flow I are clocked onto memory block 124 as bits of data flow II through a second parallel data lead 146 in a round-robin fashion using input FSM pointer 122. In clocking the bits of data flow I into memory block 124, input FSM pointer 122 begins at a memory block bit-0, increments by the bit-length of words forming input data flow I, and resets to memory block bit-0 when the range of memory block 124 is exceeded.

A third parallel data lead 148 connects output FSM module 126 to memory block 124 for reading data out of memory block 124. Output FSM module 126 reads data out of memory block 124 in a round-robin fashion controlled by output FSM pointer 128, beginning at memory block bit-0 and incremented by an output bit-length signal B at each increment of output clock increment signal $t_2$ as a data flow III. It is contemplated input clock increment signal $t_1$ have a different increment interval (e.g., frequency) than output clock increment signal $t_2$, output FSM module 126 thereby reading data output of memory block 124 on a different interval than that at which input FSM module 120 clocks data into memory block 124 with data flow III having a bit rate that is equivalent to that of data flow II. Output FSM pointer 128 resets to memory block bit-0 when the range of memory block 124 is exceeded. Data flow III is provided by output FSM module 126 to output latches block 136 over a parallel data lead 150. Output latches block 136 in turn provides output parallel data C to downstream data path 116 (shown in FIG. 1) over an output data lead 152 in correlation with output clock increment signal $t_2$, received over output clock lead 142.

PLL module 134 controls that timing of read events to memory block 124 relative to write events to memory block 124. In this respect PLL module receives input clock signal $t_1$ and output word bit-length signal W, and generates output clock signal $t_2$ therefrom by scaling input clock increment signal $t_1$ according to a ratio of the word bit-length of input parallel data A and word bit-length of output parallel data C. The ratio output clock increment frequency, i.e. $t_2$, to input clock increment frequency, i.e. $t_1$, guarantees that data is read out of memory block 124 at exactly the same rate, i.e. bits per second (bps), that data is written to memory block 124.

Figure 3A:
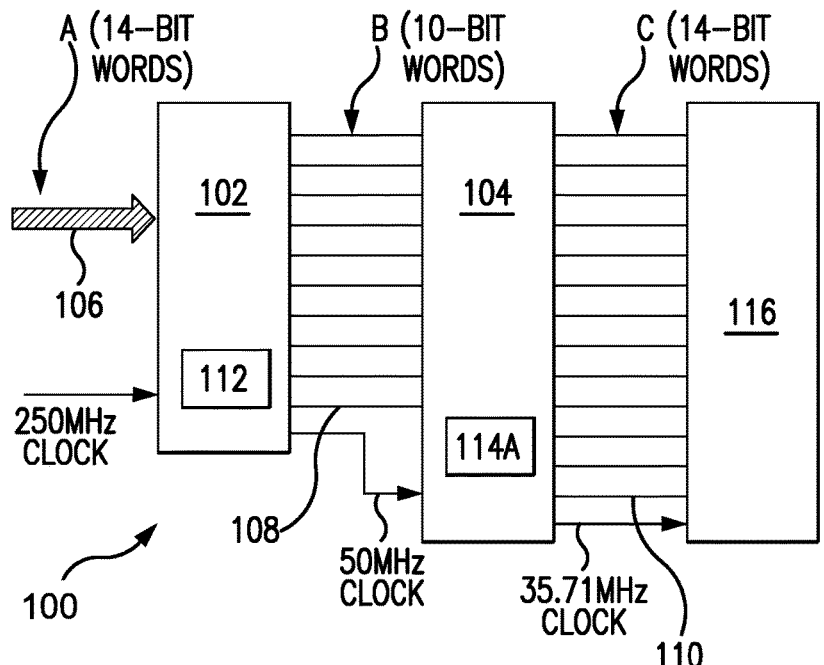
FIGS. 3A-3C are schematic views of the digital communication device of FIG. 1 according to an embodiment, showing the gearbox module deserializing input words using different temporal translation factors.
Figure 3B:
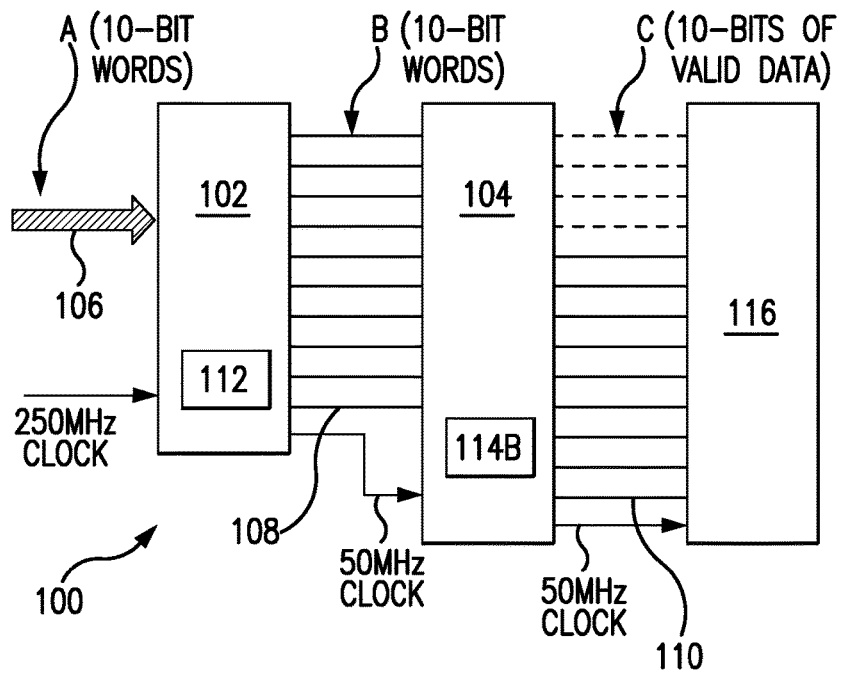
Figure 3C:
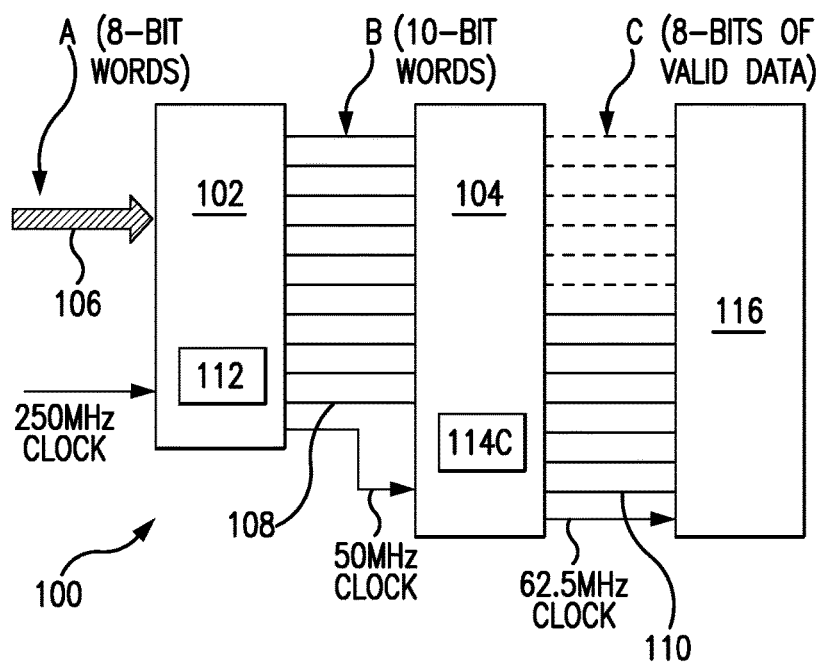

With reference to FIGS. 3A-3C, digital communication interface 100 with different temporal translation factors, e.g., a first temporal translation factor 114A, a second temporal translation factor 114B, and a third temporal translation factor 114C suited to different input parallel data word sizes, is shown. Referring to FIG. 3A, first temporal translation factor 114A configures digital communication interface to deserialize 14-bit input parallel data A input at a data rate of 250 megahertz into parallel data having a 10-bit word size and a data rate of 50 megahertz, translate the 10-bit parallel data into 14-bit data having a data rate of 35.71 megahertz using first temporal translation factor 114A, and provide the 14-bit data to downstream data path 116. This allows digital communication interface 100 to receive 14-bit parallel data, which is otherwise incompatible due to fixed deserialization factor 112.

Referring to FIG. 3B, second temporal translation factor 114B configures digital communication interface to deserialize 10-bit input parallel data A input at a data rate of 250 megahertz into parallel data having a 10-bit word size and a data rate of 50 megahertz. Gearbox module 104 translates the 10-bit parallel data into 10-bit data also having a data rate of 50 megahertz using second temporal translation factor 114B, and provides the 10-bit data to downstream data path 116.

Referring to FIG. 3C, third temporal translation factor 114C configures digital communication interface to deserialize 8-bit input parallel data A input at a data rate of 250 megahertz into parallel data having a 10-bit word size and a data rate of 50 megahertz, translate the 8-bit parallel data into 14-bit data having a data rate of 62.5 megahertz using second temporal translation factor 114B, and provide the 8-bit data to downstream data path 116. This allows digital communication interface 100 to receive 8-bit parallel data, which is otherwise incompatible due to fixed deserialization factor 112.

Figure 4:
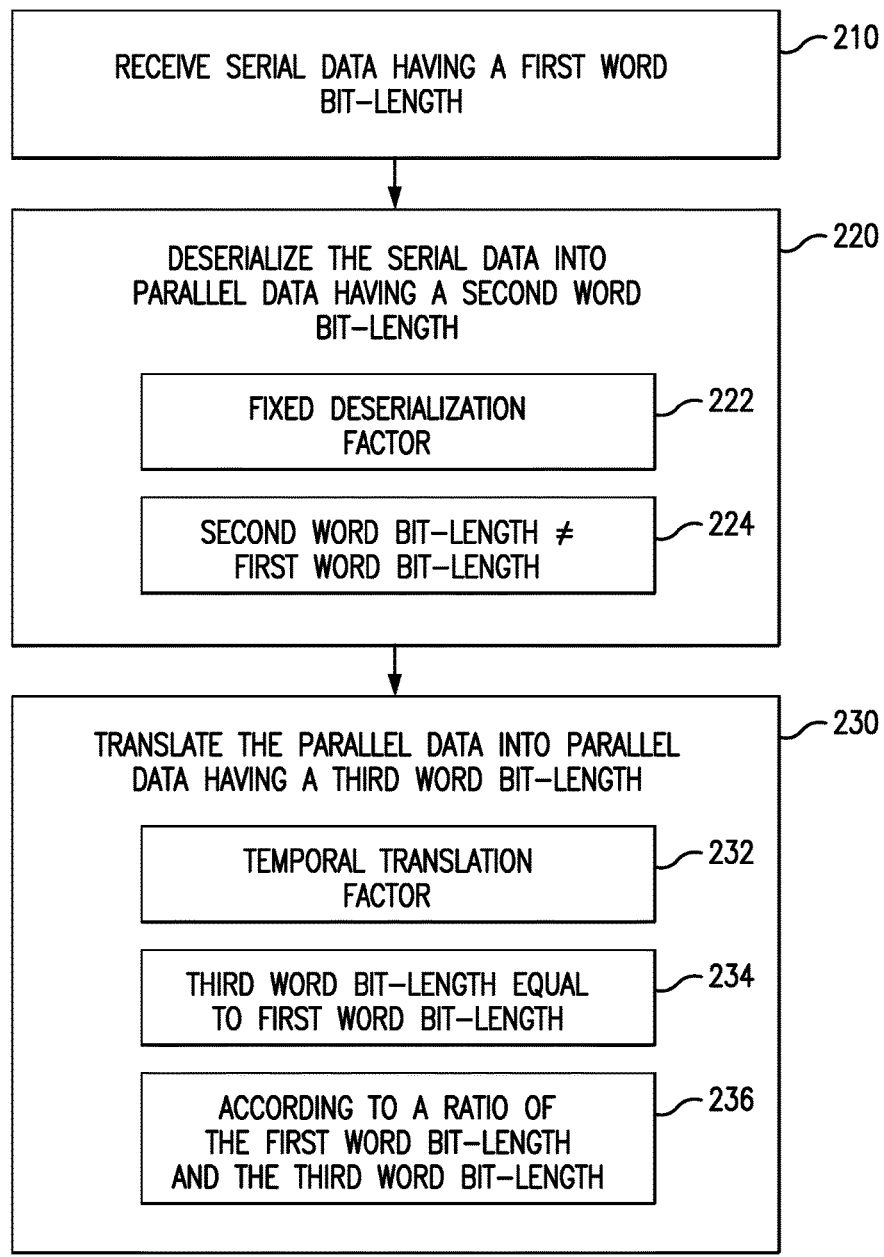
FIG. 4 is block diagram of a digital communication method, showing deserialization of serial data of a first word bit-length into parallel data of a second word bit-length, and thereafter translating the parallel data of the second word bit-length into parallel data of a third word bit-length.

With reference to FIG. 4, a digital communication method 200 is shown. Serial data having a first word bit-length is received at a deserialization device, e.g., deserialization module 102 (shown in FIG. 1), as shown with box 210. The received serial data is deserialized into parallel data at the deserialization device into parallel data having a second word bit-length, as shown with box 220. It is contemplated that that deserialization of the received serial data can include applying a fixed deserialization factor, e.g., fixed deserialization factor 108 (shown in FIG. 1), as shown with box 222. The second word bit-length can greater than the first word bit-length, as shown with box 224. The second word bit-length can be smaller than the first word bit-length, as also shown with box 224. It is to be appreciated and understood that, in accordance with certain embodiments, the second word bit-length can be equivalent to the first word bit-length.

Method 200 also includes translating the parallel data into parallel data having a third word bit-length using a gearbox module, e.g., gearbox module 104 (shown in FIG. 1), as shown with box 230. Translating the parallel data can include using a temporal translation factor, e.g., temporal translation factor 114, as shown with box 232. The temporal translation factor can be smaller than, equivalent to, or greater than the fixed deserialization factor, as suitable for a given application. It is contemplated that the third word bit-length can be equal to the first word bit-length, as shown with box 234. The third word bit-length can be unequal, e.g., greater than or smaller than, the second word bit-length, as shown with box 234. It is contemplated that the translating the parallel can include clocking parallel data into and out of a memory block, e.g., memory block 124 (shown in FIG. 2), as different rates, as shown with box 236. The rate can correspond to a ratio of the first word bit-length and the second word bit-length, as shown with box 236.

High-speed serial communication needs to be deserialized when getting read into an FPGA. Some FPGA devices limit the number of bits that can be deserialized into a parallel data word, which can make it difficult to clock in words having certain bit-lengths. For example, some FPGA devices cannot deserialize to odd numbers of bits or to numbers of bits above ten, which makes it impossible to deserialize, for example, 14-bit words using such FPGA devices.

In embodiments described herein a gearbox is used to translate deserialized, parallel data of one word bit-length into another word bit-length. In certain embodiments, at the expense of one phase-locked-loop output, the gearbox allows an FPGA device to deserialize input data with any deserialization factor, and then translate the resultant words into any other deserialization factor. The translation retains the total bandwidth (i.e. bits-per-second) while reshaping the deserialized, parallel data into words of bit-length suitably sized for downstream parallel data processing devices. For example, serial data having word bit-lengths of 10-bits can be received at 50 megahertz, deserialized, and translated into parallel data having word bit-lengths of 14-bits at a rate of 35.71 megahertz. This allows having an incompatible format for certain families of FPGA devices without purposefully adding extra padded bits to serialized data to make serial transmission compatible with certain types of devices. Moreover, as the gearbox allows for translation between any serialization factor arbitrarily, there is no need to add extra bits, and words are transmitted without padding (i.e. with read data only).

The methods and systems of the present disclosure, as described above and shown in the drawings, provide for digital communication interfaces with superior properties including one or more of the capability to convert a deserialization factor that is not natively supported by certain types of FPGA devices, allow for on-the-fly switching between deserialization factors, and/or deserialize input data having different word sizes using a common FPGA devices which is incompatible with one or more of the input data word bit-lengths. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A digital communication interface, comprising:
a deserializer module with a fixed deserialization factor; and
a gearbox module connected to the deserializer by a parallel communication channel, wherein the gearbox module has a plurality of temporal translation factors to change bit-length of words received through the parallel communication channel to a bit-length suitable for a downstream data path,
wherein a first of the plurality of temporal translation factors is greater than the fixed deserialization factor, and
wherein a second of the plurality of temporal translation factor is equal to the fixed deserialization factor.

2. The digital communication interface as recited in claim 1, wherein a third of the plurality of temporal translation factors is smaller than the fixed deserialization factor.

3. The digital communication interface as recited in claim 1, wherein the gearbox module further comprises an input finite state machine (FSM) module connected in series between the deserialization module and a memory block.

4. The digital communication interface as recited in claim 3, wherein the gearbox module further comprises a phase-locked loop (PLL) module connected to the input FSM module.

5. The digital communication interface as recited in claim 4, further comprising an input clock lead connected to the PLL module for writing data to the memory block according to an input clock signal provided to the PLL module.

6. The digital communication interface as recited in claim 1, wherein the gearbox module further comprises an output FSM module connected to a memory block.

7. The digital communication interface as recited in claim 6, wherein the gearbox module further comprises a PLL module connected to the output FSM module.

8. The digital communication interface as recited in claim 7, further comprising an output clock lead connecting the PLL module to the memory block for reading data out of the memory block according to a clock output signal generated by the PLL module.

9. The digital communication interface as recited in claim 6, wherein the gearbox module further comprises an output latches block connected to the memory block.

10. The digital communication interface as recited in claim 1, wherein the fixed deserialization factor is 10:1, wherein the plurality of temporal translation factors are selected from a group including 8:1, 10:1, and 14:1.

11. A field programmable gate array device including a digital communication interface as recited in claim 1.

12. A digital communication method, comprising:
receiving serial data having a first word bit-length;
deserializing the serial data into parallel data using a fixed deserialization factor, wherein the parallel data has a second word bit-length; and
translating the parallel data into translated parallel data using a plurality of temporal translation factors, wherein the translated parallel data has a third word bit-length that is equivalent to the first word bit-length,
wherein the third word bit-length is greater than the second word bit-length when using a first of the plurality of temporal translation factors, and
wherein the third word bit-length is equivalent to the second word bit-length when using a second of the plurality of temporal translation factors.

13. The digital communication method as recited in claim 12, wherein the third word bit-length is greater than the second word bit-length when using a third of the plurality of temporal translation factors.

14. The digital communication method as recited in claim 12, further comprising setting the fixed deserialization factor by applying power to a field programmable gate array device.

15. The digital communication method as recited in claim 12, further comprising switching between a first and a second of the plurality of deserialization factors while power is applied to a field programmable gate array device.

16. The digital communication method as recited in claim 12, further comprising switching between a first and a second of the plurality of deserialization factors by changing an output word bit-size setting.

* * * * *